(12) United States Patent
Kirsch

(10) Patent No.: US 6,265,922 B1
(45) Date of Patent: Jul. 24, 2001

(54) CONTROLLABLE LATCH/REGISTER CIRCUIT

(75) Inventor: Graham Kirsch, Tadley (GB)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/219,567

(22) Filed: Dec. 22, 1998

(30) Foreign Application Priority Data

Dec. 22, 1997 (GB) .................................................. 9727024

(51) Int. Cl.[7] ...................................................... H03K 3/12
(52) U.S. Cl. ............................ 327/199; 327/202; 327/213
(58) Field of Search ................................... 327/199, 200, 327/202, 212, 213, 141; 326/93, 94, 96

(56) References Cited

U.S. PATENT DOCUMENTS

| | | | |
|---|---|---|---|
| 4,703,257 | 10/1987 | Nishida et al. | 324/73 R |
| 4,864,161 | 9/1989 | Norman et al. | 307/272.2 |
| 5,317,205 | 5/1994 | Sato | 307/443 |
| 5,321,399 * | 6/1994 | Notani et al. | 327/203 |
| 5,378,934 * | 1/1995 | Takahashi et al. | 327/203 |
| 5,416,362 * | 5/1995 | Byers et al. | 327/219 |
| 5,459,736 | 10/1995 | Nakamura | 371/22.3 |
| 5,703,513 * | 12/1997 | Hashizume et al. | 327/202 |
| 5,945,858 * | 8/1999 | Sato | 327/202 |
| 6,005,422 * | 12/1999 | Morinaka et al. | 327/199 |
| 6,060,924 * | 5/2000 | Sugano | 327/202 |

\* cited by examiner

*Primary Examiner*—Timothy P. Callahan
*Assistant Examiner*—An T. Luu
(74) *Attorney, Agent, or Firm*—Oppenheimer Wolff & Donnelly LLP (57) ABSTRACT

A controllable latch/register circuit for an integrated circuit comprises an input latch (30) coupled in series with an output latch (32). The latches are operated under control of a control circuit (34) having mode inputs. In one mode, the latches are operated as a non-transparent register; the output latch (32) holds the output stable while new data is inputted to the input latch (30); the output latch (32) is only opened once the input latch has been latched closed. In one or more other modes, the latches are operated as a single controllable transparent latch; for example, one or the latches (30) can be held permanently open such that operation of the circuit depends entirely on the state of the other latch (32). Applications include dual purpose interface circuits for synchronous and asynchronous memories, and configurable circuits operable as high speed latches during normal operation, and as scan-test registers during a scan-test operation, thus avoiding the problems of dedicated latch-only and register-only circuits.

16 Claims, 9 Drawing Sheets

Note:
Latch Mode is expected to be two strap pins: they should not change during normal operation. If they do, the contents of the register will go unknown.

Register data is held in slave latch. This makes it easier to switch to scan mode.

Latch Mode Values:
0: Register
1: Open Master Latch, Slave Open = Clock AND Load Enable
2: Open Master Latch, Slave Open = not Clock AND Load Enable
3: Open Master Latch, Slave Open follows Load Enable

Boolean Equations:

teb = te
tenb = $\overline{te}$
idb = id
le = ld1+ld2
cpb = {cp•ce•($\overline{lm1}$•$\overline{lm0}$+te)+le•$\overline{te}$•[lm0•(cp+lm1)+lm1•cp]}•$\overline{hd}$+id
cpnb = (lm1•$\overline{te}$+lm0•$\overline{te}$+$\overline{cp}$+$\overline{ce}$)•id

CONTROLLABLE LATCH/REGISTER CIRCUIT

FIELD OF THE INVENTION

This invention relates to a controllable latch/register circuit, especially (but not exclusively) for implementation within an integrated circuit.

BACKGROUND OF THE INVENTION

Latches and registers are used commonly in many various types of integrated circuits for temporary storage of signals between circuit elements and for interfacing to external circuitry. Latches are transparent when open, and latch the data when closed. In contrast, registers have independent input and output buffers, to provide a stable output during loading of subsequent data. The register is never transparent, since the output buffer holds the previous outputs stable until the input buffer has closed, whereupon the data in the input buffer is transferred to the output buffer.

For reference, a known design of register circuit is described with reference to FIGS. 1 and 2. The register comprises an input (master) latch 10 coupled in series with an output (slave) latch 14. The latches are controlled by a so-called "hat" cell 12 which generates control pulses to open each latch in turn to provide register operation. This is illustrated in the timing diagram of FIG. 2. During a load enable cycle, the master latch is opened during first clock pulse 16 to admit input data into the master latch 10. The master latch is transparent when open but, during the cycle 16, the slave latch remains closed, thus keeping the original output stable. During the subsequent clock pulse 18 (while the enable signal is still active), the master latch 10 is closed to latch the data held in the master latch 10, and the slave latch 12 is opened to admit the data through to the register output.

Registers typically are used for circuits in which a stable output is required throughout a processing cycle, and transparent operation is not desirable. In contrast, latches on their own are used in preference to registers for circuits which do not require a stable output through a processing cycle; such latches provide a considerable speed advantage in generating an output immediately on an enable signal loading the signal into the latch.

However, the use of independent latches does not provide full compatibility with register scan testing which is becoming an important technique for testing integrated circuits. Scan testing utilises a special scheme for shift-loading known test values into registers of an integrated circuit x, running the circuit for a controlled number of cycles (for example, only one cycle), and then shift-loading all of the result values from the registers. By comparing the actual result values with the correct theoretical values, the functionality of the circuit can be tested thoroughly. However, scan testing relies on shift-register operation to shift the data values serially into and out of the integrated circuit. Such register operation is not supported by independent latches because the latches become transparent when open. Although it is possible to read latched values separately (requiring the use of additional logic circuits and data paths), it is not normally possible to combine registers and latches in a single scan-test data path.

Circuits exhibiting both latch and register behaviour are known, for example, in certain core interface circuits capable of interfacing with either synchronous or asynchronous memory. Generally, a transparent latch is preferred for accessing synchronous memory, because the address and control signals are required only at a cycle edge, and the signals are interfaced more quickly with a latch. However, for asynchronous memory, stable signals are required throughout the cycle, requiring the use of an interface register.

Figure 3:
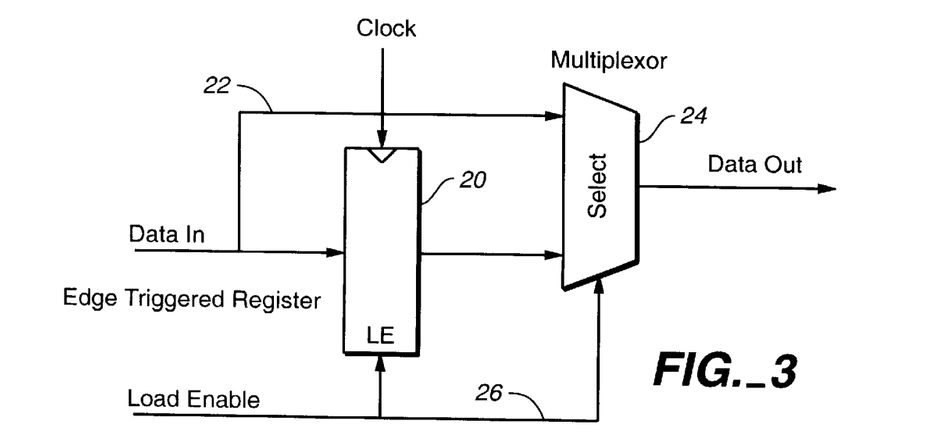
(FIG. 3 is a schematic circuit diagram of a prior art register/latch behaviour circuit)

An example of a conventional circuit for providing both latch and register behaviour is illustrated in FIG. 3. The circuit consists of an edge triggered register 20, and a bypass path 22. The output from the register 20 and the bypass path are fed to a multiplexor 24, which selects one of the signals for output depending on a "select" signal 26 which doubles as the "load enable" signal for the register 20. When the register is enabled for loading (i.e. the output does not represent the signal being inputted), the multiplexor selects the bypass signal, to allow the signal directly through to the output (transparent latch behaviour). When the load enable signal is deactivated, the multiplexor selects the stable register output (register behaviour).

However, such a circuit is not ideal because the presence of the multiplexor requires additional chip space, and increases the circuit cost. Moreover, the circuit is not suitable as a universal latch/register because it may not provide precisely the same timing characteristics as a conventional latch or a conventional register. This complicates modelling of the circuit element to simulate operation of the overall circuit environment.

The present invention has been devised bearing the above problems in mind.

SUMMARY OF THE INVENTION

In one aspect, the invention provides a circuit operable as a register or as a latch, the circuit comprising a first latch coupled in series to a second latch, and a control circuit operable to control operation of the first and second latches in a first mode in which the latches are controllable to behave substantially as a single latch, and in a second mode in which the first and second latches are controllable to provide register operation.

With the invention, a circuit can be provided which is not significantly more complicated than a register, but which can be controlled to provide either fully compatible latch operation, or fully compatible register operation.

For example, in the first mode, one of the latches could be controlled to be open permanently, or at least for the majority of a cycle. When held open throughout a cycle, the latch is totally transparent (i.e. the output always equals the input, and so the presence of that latch has no effect on the signal). The circuit is thus be equivalent to a single latch (i.e. the remaining latch) which can be controlled in a conventional manner.

Preferably, the control circuit is operable in a plurality of different modes to hold one or the latches open, the other latch being controllable to respond differently, depending on the mode, to one or more external timing and/or control signals, for example, a clock signal and a load enable signal.

In one form, the latch/register circuit (also referred to herein as a "latchister") may be used as a universal circuit for implementing latches and for implementing registers. The use of such a universal circuit can simplify cell design, and can provide standard timing, thus simplifying modelling of the circuit in a timing model.

In a preferred embodiment, the latchister is used as an interface circuit for providing a buffer to external memory, which may be synchronous or asynchronous memory. The latchister can be configured to provide optimum latch or register characteristics to suit the type of memory.

In another preferred embodiment, the latchister is used in a circuit to provide latching operation during normal operation of the circuit, but is coupled to other registers or latchisters to provide scan-test register operation during scan-testing. Such a technique is extremely important in enabling scan-testing of a circuit while still allowing the speed advantages of latches to be exploited when the circuit is in normal use.

BRIEF DESCRIPTION OF THE DRAWINGS

Embodiments of the invention are now described by way of example only, with reference to the accompanying drawings, in which.

DESCRIPTION OF PREFERRED EMBODIMENTS

Figure 1:
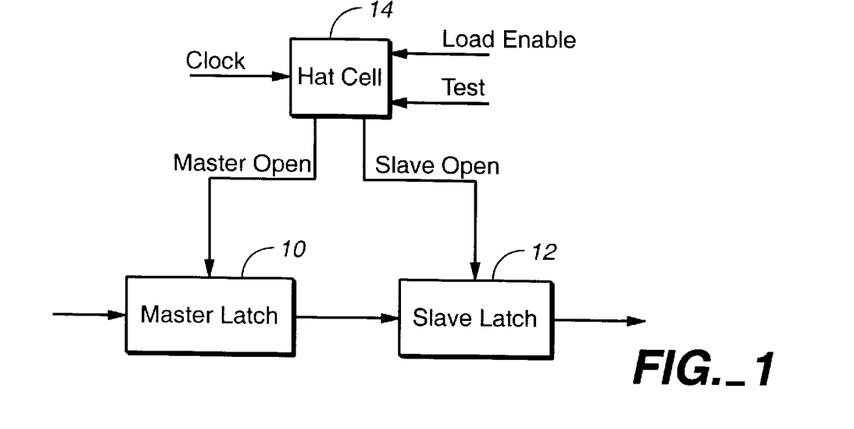
(FIG. 1 is a schematic circuit diagram of a prior art register)
Figure 2:
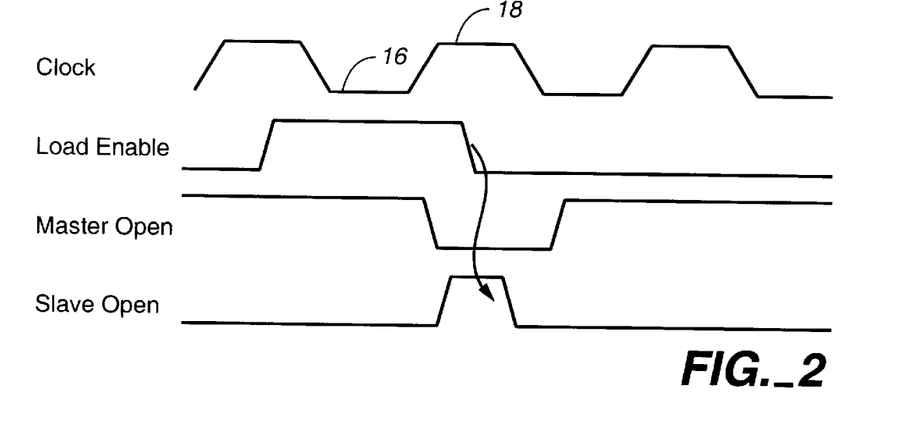
(FIG. 2 is a schematic timing diagram for the register of FIG. 1)
Figure 4:
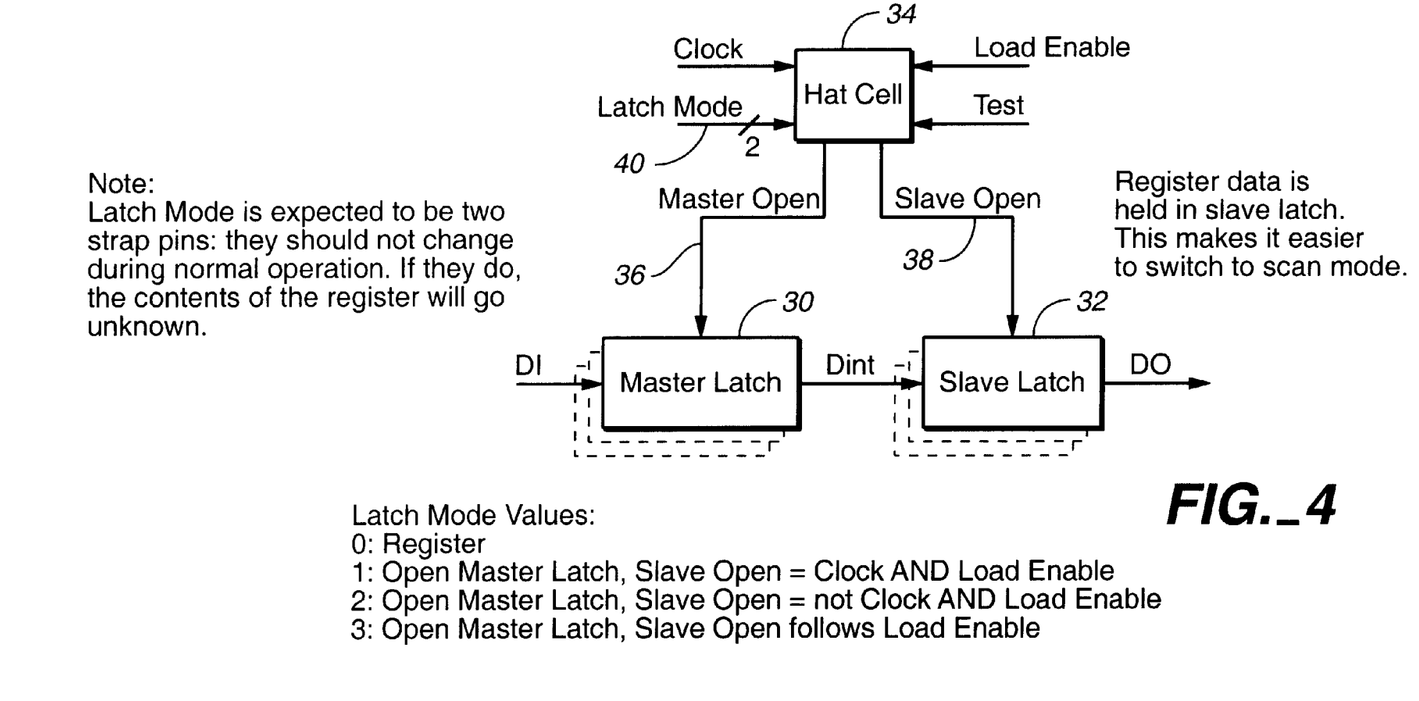
FIG. 4 is a schematic circuit diagram of a latchister.

Referring to FIG. 4, the latchister is similar in some respects to the prior art register of FIG. 1 in that it comprises a first latch (also called a master latch) 30 having its output $D_{int}$ coupled to the input of a second latch (also called a slave latch) 32. The input $D_i$ of the master latch 30 represents the latchister input, and the output $D_o$ of the slave latch 32 represents the latchister output.

Operation of the master latch 30 is controlled by control circuit 34 similar to the control circuit 14 of FIG. 1. The latchister control circuit 34 produces a master control signal 36 for controlling whether the latch is open (i.e. transparent) or closed (i.e. output latched). The slave latch 32 is likewise controlled by the control circuit 34 through a slave control signal 38.

Compared to the prior art control circuit 14, the latchister control circuit 34 is modified by having a mode input 40 for controlling the operating mode of the latchister, either as a register, or as a latch. In the present embodiment, the mode input 40 comprises two control lines, which can represent in binary a mode value in the range 0–3. Operation of the different modes is best understood with reference to the timing diagrams of FIG. 5.

Figure 5:
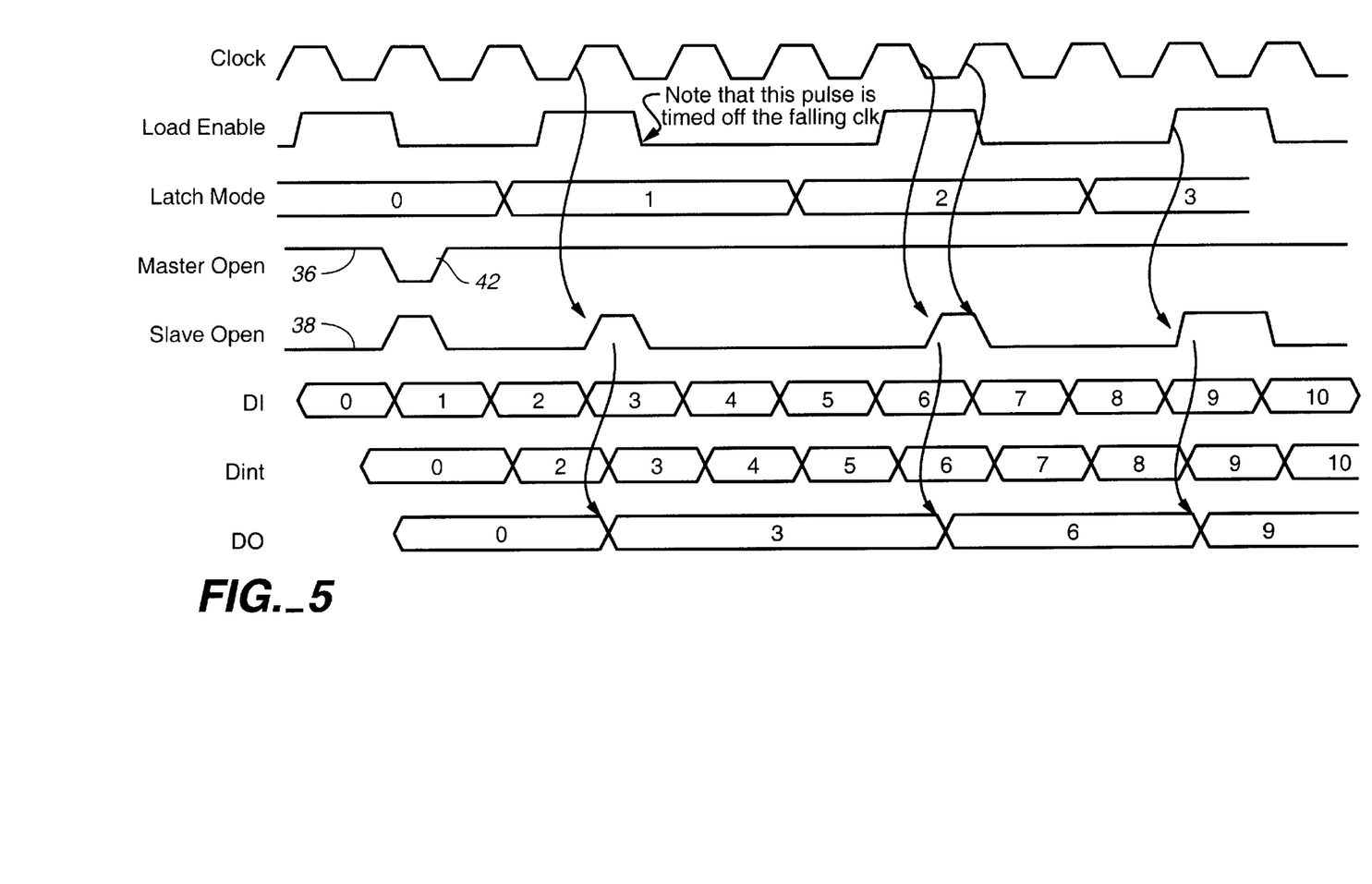
FIG. 5 is a schematic timing diagram for the latchister.

In mode 0, the latchister behaves as a register. The master control signal 36 is normally high (master latch open), but is taken low (at pulse 42) on the rising edge of a clock pulse when the load enable signal is active. The slave control signal 38 is the inverse of the master control signal 36, such that the slave latch 32 only opens when the master latch 30 is closed, upon termination of a load enable signal. The data in the master latch 30 is then transferred to the slave latch 32.

In modes 1, 2 and 3, the latchister behaves as a latch, the different modes providing different latching characteristics. It is evident from the timing diagram that, in these latch modes (1–3), the master control signal 36 is always high, meaning that the master latch 30 is held permanently open. In this condition, the master latch 30 is totally transparent, and has no effect in the circuit. The latchister thus resembles a single latch, formed by the slave latch 32.

In mode 1, the slave control signal 38 is active to open the slave latch 32 as a result of a logical AND of the load enable signal and the clock signal.

In mode 2, the slave control signal 38 is active to open the slave latch 32 as a result of a logical AND of the enable signal with the inverse of the clock signal. This provides slightly different phase timing with respect to mode 1.

In mode 3, the slave control signal 38 follows the load enable signal exactly, and is independent of the clock signal.

In the above embodiment, the master latch 30 is held open when latch operation is desired. In other embodiments, the slave latch could be held open instead, or the permanently open latch may depend on which particular latch mode is selected. As a further alternative, the master and slave control signals 36 and 38 could be controlled to be identical, thus opening and closing the master and slave latches 30 and 32 in unison, as a single effective latch.

As illustrated in phantom in FIG. 4, the latchister may typically comprise parallel channels of master-slave latch pairs, all controlled by the same master and slave control signals controlling the first master-slave latch pair. This enables the latchister to handle parallel signals representing multiple bits of data.

Figure 6:
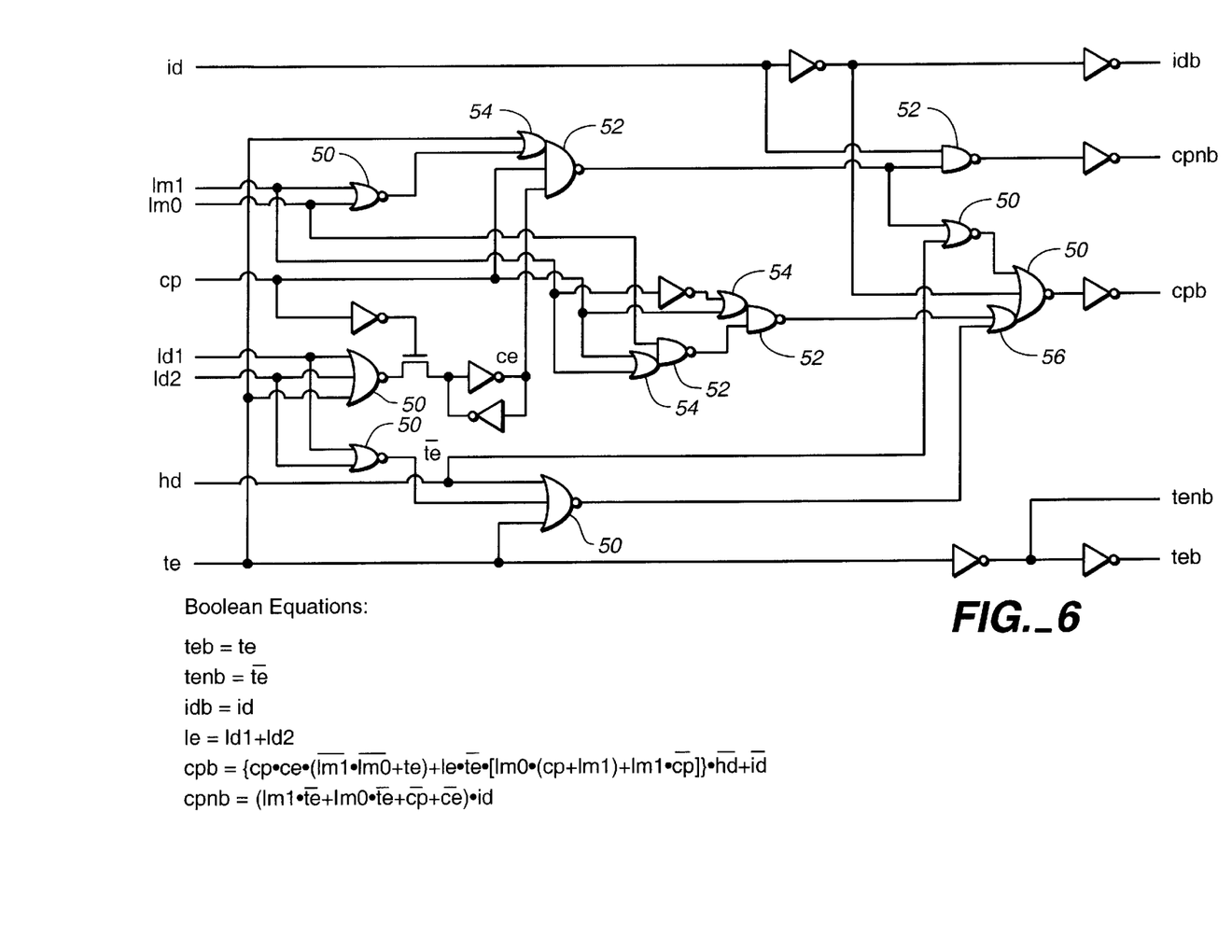
FIG. 6 is a schematic circuit diagram of the control circuit in the latchister.

FIG. 6 illustrates an example control circuit 34 employing NOR gates 50, NAND gates 52, OR gates 54 and AND gates 56. The functional Boolean equations defining the output signals are also identified in this figure.

In addition to the clock input CK, and mode inputs MO1, MO2, the control circuit 34 has a reset (or initialise-data I-D) input for setting the latches in a predetermined reset state, a test input TE for forcing the latchister to behave as a register, a hold (or load over-ride) input HD for inhibiting response to any load enable signals, and two separate load enable inputs LD1 and LD2. The test input TE, hold input HD and the extra load enable input LD2 are used during scan-testing, which is described hereinafter.

Having described the basic elements and function of the latchister, the following description covers example applications of the latchister in integrated circuits.

Figure 7:
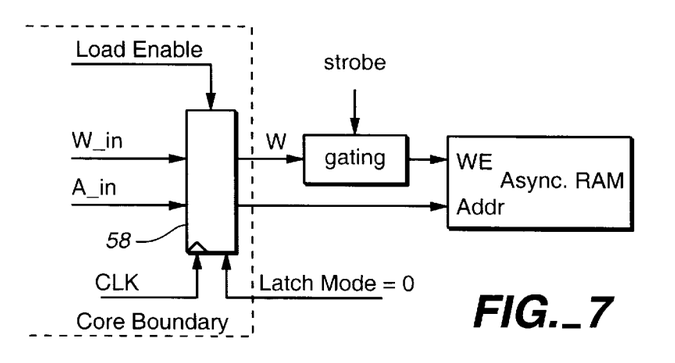
FIG. 7 is a schematic circuit diagram showing the latchister for an asynchronous memory interface.
Figure 8:
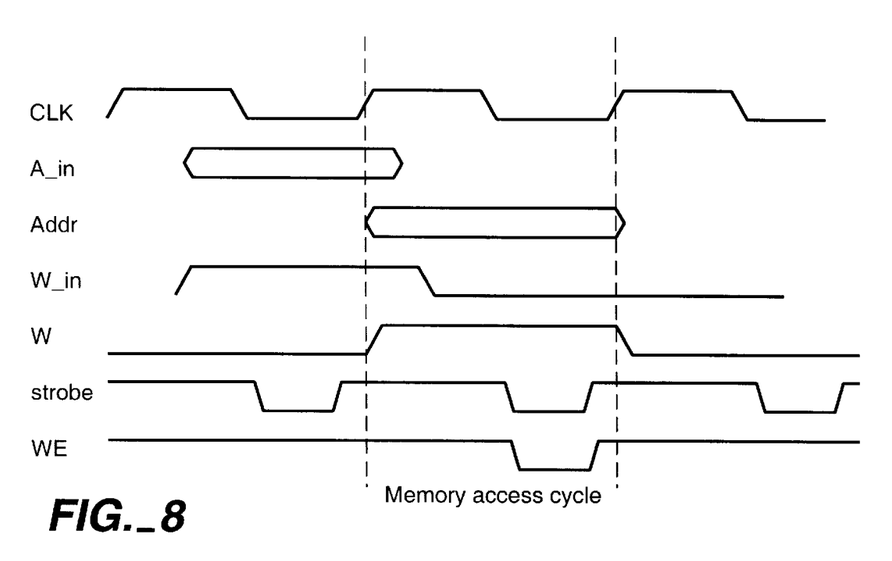
FIG. 8 is schematic timing diagram for the circuit illustrated in FIG. 7
Figure 9:
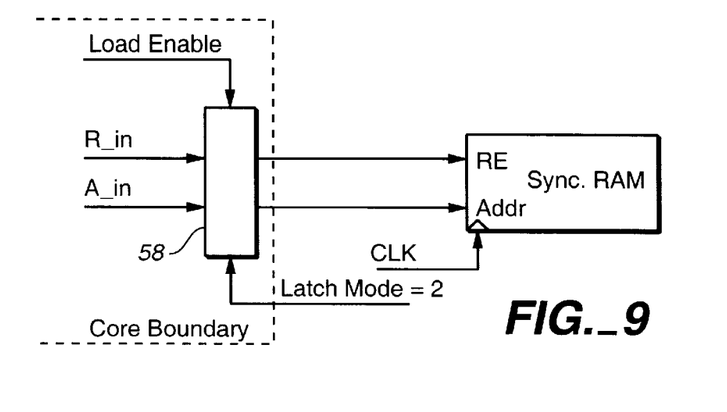
FIG. 9 is a schematic circuit diagram showing the latchister for a synchronous memory interface.

FIGS. 7 and 9 illustrate the latchister 58 used as an interface buffer in a core circuit for interfacing external memory. The latchister provides dual purpose operation to suit either synchronous or asynchronous RAM. As explained hereinbefore, asynchronous RAM requires data, address and control signals to be stable throughout the access cycle, and to use such memory, the latchister 58 in FIG. 7 is configured in mode 0 (register). The associated timing diagram is illustrated in FIG. 8.

Figure 10:
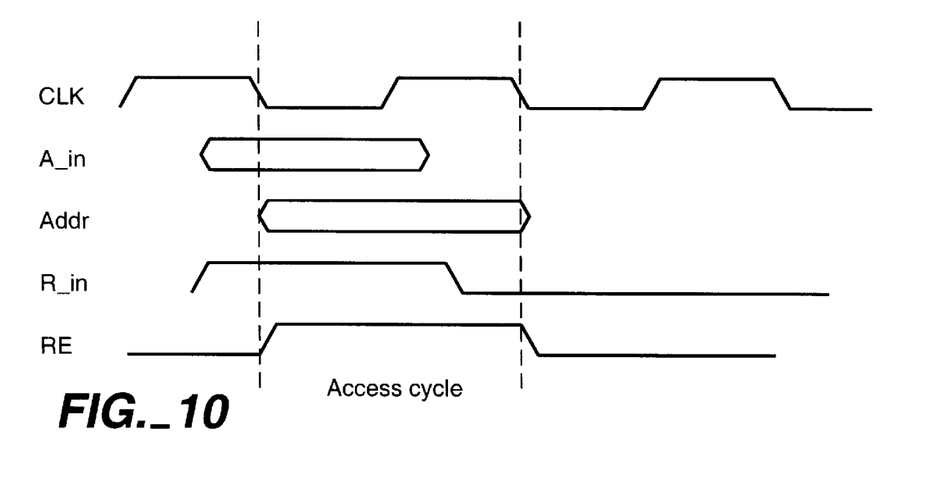
FIG. 10 is a schematic timing diagram for the circuit illustrated in FIG. 9.

On the other hand, for synchronous RAM, a transparent latch may be more desirable, which can drive valid address or control signals early. To use such memory, the latchister 58 in FIG. 9 is configured in mode 2 (latch). The associated timing diagram is illustrated in FIG. 10.

Figure 11A:
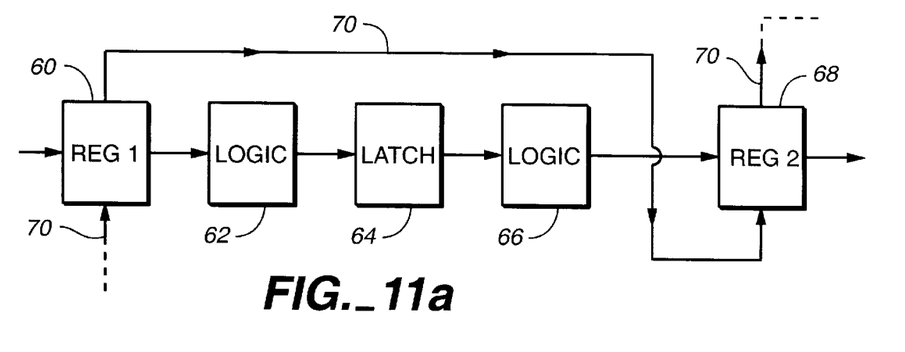
FIGS. 11a and 11b are schematic circuit diagrams illustrating scan-testing with, and without, latchisters.
Figure 11B:
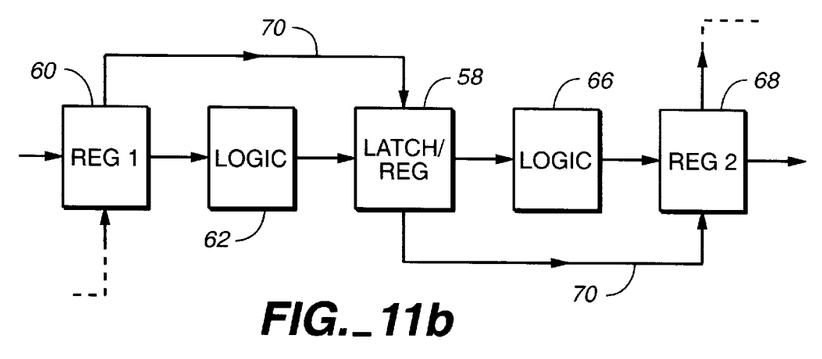

FIGS. 11a and 11b illustrate how latchisters can be used to facilitate scan-testing where this would not normally be possible using standard latches. Referring firstly to FIG. 11a, an example logic circuit is shown employing a conventional latch. The circuit consists of an input register 60, a first combinatorial logic circuit 62 producing a first result stored by the latch 64, a second combinatorial logic circuit 66 for processing the data stored by the latch 64, and an output register 68. In this circuit, the latch 64 is used between the logic circuits 62 and 66 to temporarily store data; a latch is preferred as this provides significant speed advantages compared to a non-transparent register which would delay the throughput of data between the logic circuits.

During scan-testing, operation of the circuit is halted, and the registers 60 and 68 are coupled together by logic (not shown) to define a scan path 70. Predetermined "source" data can then be loaded serially by operating the registers in a shift-register mode to shift the data through the registers in turn. Although only two registers are illustrated in this example, it will be appreciated that an integrated circuit will typically contain a large number of registers connected in this manner. The circuit is then clocked, for example, by one or more clock cycles, and is then halted. The "result" data can then be read out from the registers, using a reverse shift-register operation, after which the result data may be analysed to detect any faults in the circuits.

In the conventional circuit of FIG. 11a, it is not possible to include the latch 64 in the scan-test path 70 because the latch is not capable of shift-register operation. When the latch elements are "open" the latch becomes transparent. This means that the scan-test is not as complete as would be desirable; the technique can only test operation of the first and second logic circuits in combination, not individually.

Referring to FIG. 11b, the above problems can be overcome by using a latchister 58 in place of the latch 64. During normal circuit operation, the latchister 58 is configured as a latch (modes 1–3) to provide the speed advantages discussed above. During scan testing, the latchister is configured as a register (mode 0) which can support shift-register operation, thus allowing the scan-test path 70 to include the contents of the latchister 58. The scan-test register mode can be implemented by asserting the test input TE described above, which forces the latchister into the register mode. The alternative load enable input LD2 facilitates shift register operation.

Figure 12:
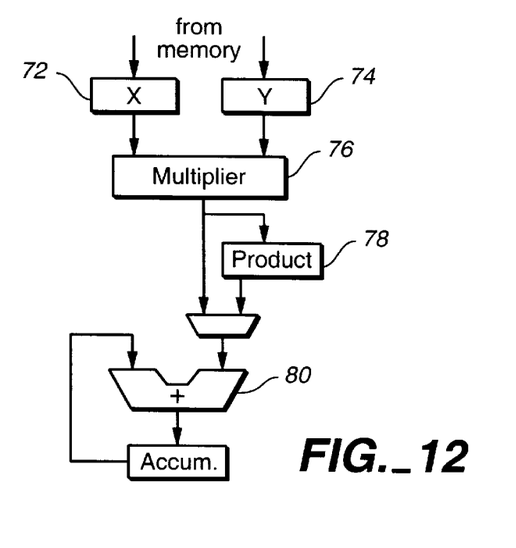
FIG. 12 is a schematic circuit diagram illustrating use of the latchister in a signal processing circuit.

Referring to FIG. 12, in a further example, latchisters are used in two modes to extend the time available to perform successive stages of a pipelined calculation. In a typical DSP application, it is often necessary to perform multiplication of data, and to accumulate the results of the multiplication operation (MAC), all within a single machine cycle. These operations are pipelined, so that as each pair of multiplicands is fetched from memory, the previous pair is multiplied and the result is added to an accumulator. The previous multiplier result generated in a previous cycle is held in a product register.

Figure 13:
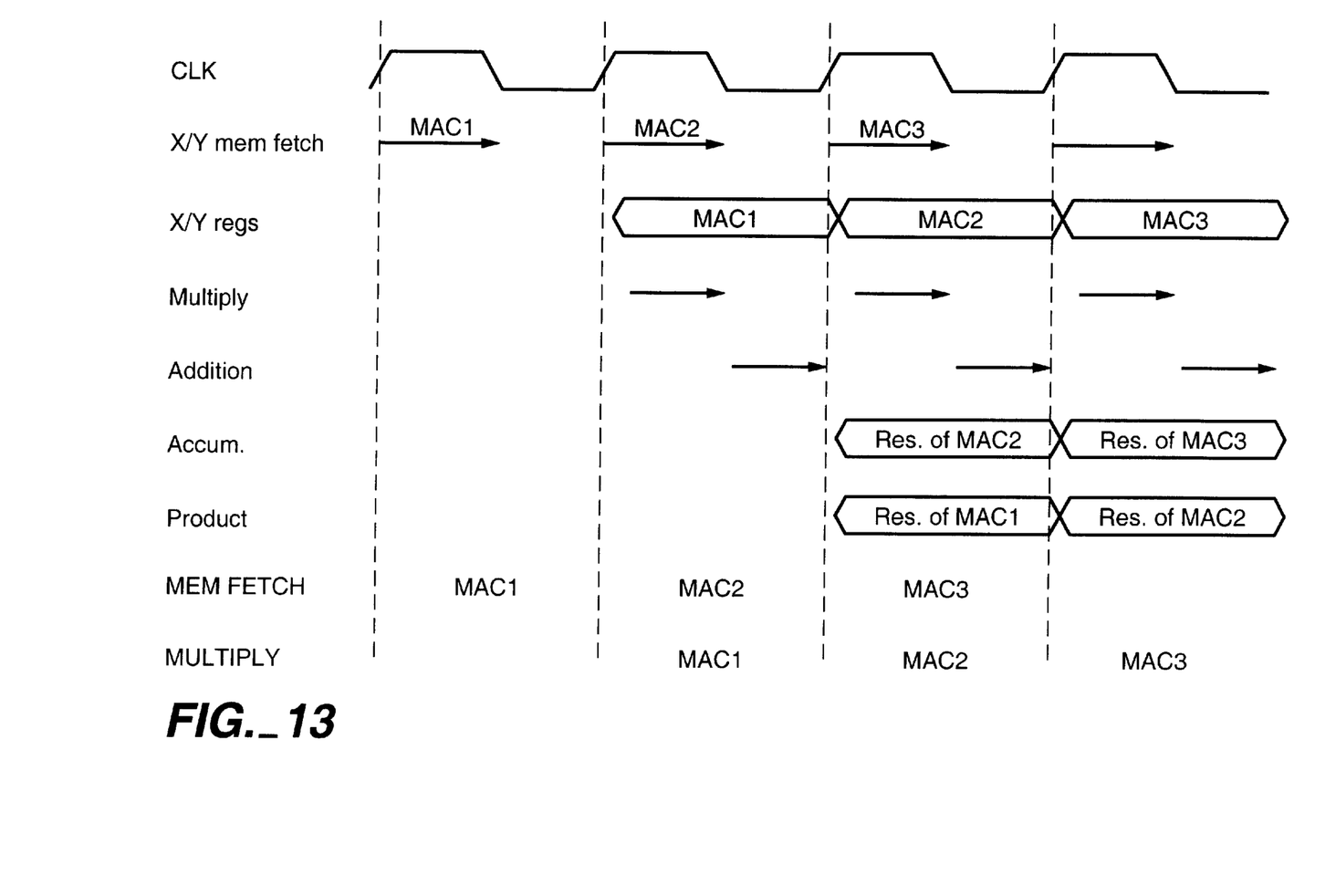
FIG. 13 is a timing diagram for the circuit of FIG. 12 when conventional registers are used.

The system includes X and Y storage registers 72 and 74 into which the multiplicands are loaded during one cycle for processing during the next cycle. The values are multiplied by a multiplier 76, and the product stored in product register 78 and added to a previous value by accumulator 80. The key limitation with such a circuit is the time taken to perform both the multiply and add operations. This limits the minimum cycle time which can be applied to the system, as illustrated in FIG. 13. In particular, the result of the accumulate operation for a given MAC operation is required to be valid in the same cycle as the product from the previous operation, due to the pipelining. Hence the multiplier output must be used for the addition at the same time as it is being loaded into the product register.

Figure 14:
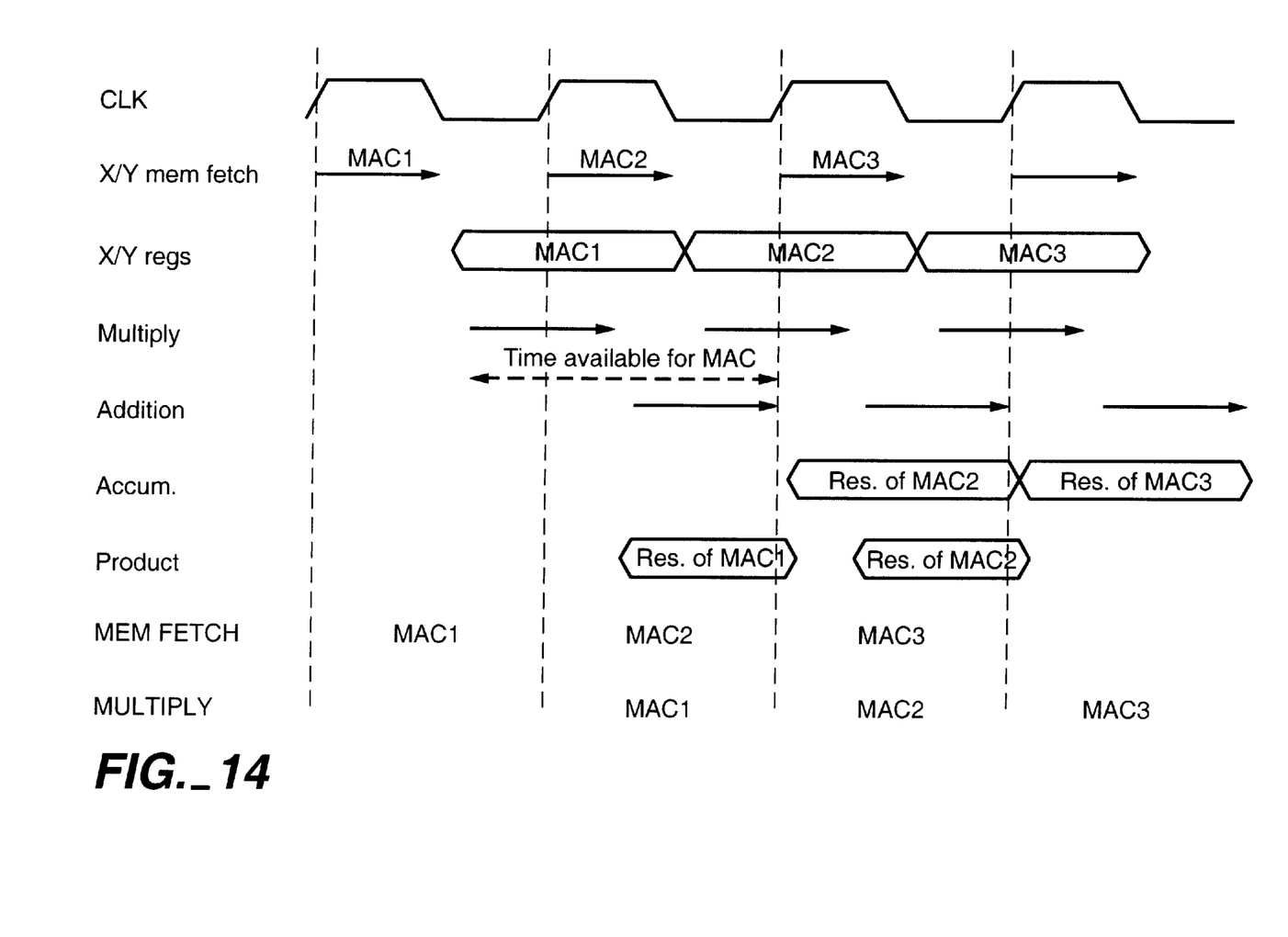
FIG. 14 is a timing diagram for the circuit of FIG. 12 when a latchister is used.

However, there is time to spare in the previous cycle, when the operands are fetched from memory into the multiplier X and Y input registers 72 and 74. By using a latch, to hold the X and Y values, open on the second half of the memory fetch cycle (i.e. a mode 2 latchister), the data can be presented to the multiplier early. This gains almost an extra half-cycle for the multiply and accumulate operation, as illustrated in FIG. 14. Since the product data is now valid earlier in the cycle, the product register must be loaded earlier—during the first half cycle of the operation. This could be achieved with a negative edge-triggered register, but this is undesirable for scan testing. However, the necessary timing function can be achieved by using a mode 1 latchister to hold the product data, in place of the register. The multiplexor can also be removed.

It will be appreciated that the invention, particularly as illustrated in the preferred embodiments, can enable a multi-purpose register/latch circuit to be implemented in a very straightforward and versatile manner, and the circuit is configurable to be fully latch compatible and fully register compatible. The circuit has important applications including enabling scan-testing of functional latches, and simplifying interface circuitry.

It will be appreciated that the above description is merely illustrative and that many modifications may be made within the scope and/or principles of the invention. Features believed to be of particular importance are recited in the appended claims. However, the Applicant claims protection for any novel feature or combination of features described herein and/or illustrated in the drawings, irrespective of whether emphasis has been placed thereon.

What is claimed is:

1. A register/latch circuit operable as a register or as a latch, the circuit comprising:
    a first latch (i) configured to receive a first control signal and (ii) be coupled in series to a second latch, wherein the second latch is configured to receive a second control signal; and
    a control circuit operable to control operation of the first and second latches in a first mode and in a second mode, wherein when in the first mode the latches are controllable to behave substantially as a single latch, and when in a second mode the first and second latches are controllable to provide register operation.

2. A circuit according to claim 1 wherein, in the first mode, one of the latches is held open during substantially an entire cycle, to provide a transparent coupling to the other latch.

3. A circuit according to claim 1, wherein the control circuit is operable in a plurality of different modes to control the latches to function as a single latch which responds differently, depending on the mode, to one or more external timing and/or control signals.

4. A circuit according to claim 3, wherein the control means is operable in one mode to open said first and/or said second latch in accordance with a control signal equivalent to, or derived using, a logical AND combination of a clock signal and an enable signal.

5. A circuit according to claim 3, wherein the control means is operable in one mode to open said first and/or said second latch in accordance with a control signal equivalent to, or derived using, a logical AND combination of a clock signal and the inverse of an enable signal.

6. A circuit according to claim 3, wherein the control means is operable in one mode to open said first and/or said second latch in accordance with a control signal equivalent to a load enable signal independently of a clock signal.

7. A circuit according to claim 1, comprising a plurality of said first latches and a plurality of said second latches, the latches being arranged in pairs to provide a multi-channel circuit.

8. An integrated circuit comprising at least one register/latch circuit operable as a register or as a latch, the circuit comprising a first latch configured to receive a first control signal coupled in series to a second latch configured to receive a second control signal, and a control circuit operable to control operation of the first and second latches in a first mode in which the latches are controllable to behave substantially as a single latch, and in a second mode in which the first and second latches are controllable to provide register operation.

9. An integrated circuit according to claim 8, comprising at least one register/latch circuit configured to operate as a latch, and at least one register/latch circuit configured to operate as a register.

10. An integrated circuit according to claim 8, wherein the majority of latch circuits are implemented as register/latch circuits configured as latches.

11. An integrated circuit according to claim 8, wherein the majority of register circuits are implemented as register/latch circuits configured as registers.

12. An integrated circuit according to claim 8, wherein at least one register/latch circuit configured normally as a latch is operable as a register for implementing a test function.

13. An integrated circuit according to claim 12, wherein the register/latch circuit is accessible for a scan-test.

14. An integrated circuit according to claim 8, wherein the register/latch circuit is implemented as an interface for synchronous or asynchronous memory.

15. A register/latch circuit operable as a register or as a latch, the circuit comprising:

means for receiving a first control signal;

means for receiving a second control signal, wherein said second means is serially coupled to said first means; and means for controlling said first and second means in (i) a first mode substantially as a single latch and (ii) a second mode providing register operation.

16. A method for operating a register/latch circuit as a register or as a latch, comprising the steps of:

(A) receiving a first control signal at a first latch;

(B) receiving a second control signal at a second latch, wherein said second latch is serially coupled to said first latch; and (C) controlling said first latch and said second latch to operate in (i) a first mode substantially as a single latch and (ii) a second mode providing register operation.

* * * * *